(12) United States Patent
Paulos et al.

(10) Patent No.: US 6,208,671 B1
(45) Date of Patent: Mar. 27, 2001

(54) ASYNCHRONOUS SAMPLE RATE CONVERTER

(75) Inventors: John Paulos; Gautham Kamath; James Nohrden, all of Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/009,708

(22) Filed: Jan. 20, 1998

(51) Int. Cl.⁷ .............. H04J 3/22; G06F 17/17; H03M 7/00; H04L 7/00

(52) U.S. Cl. .............. 370/545; 708/313; 341/61; 375/355

(58) Field of Search ................ 370/545, 538, 370/543; 708/313; 341/61; 375/355

(56) References Cited

U.S. PATENT DOCUMENTS 5,497,152 * 3/1996 Wilson et al. .................. 341/61
5,786,778 * 6/1998 Adams et al. ................. 341/61
5,892,468 * 4/1999 Wilson et al. ................. 341/61

* cited by examiner

*Primary Examiner*—Huy D. Vu
*Assistant Examiner*—Kevin C. Harper
(74) *Attorney, Agent, or Firm*—Steven Lin; Peter T. Rutkowski

(57) ABSTRACT

An asynchronous sample rate converter for converting a first sample rate in a signal to a second sample rate in the same signal is presented. The signal is first provided as input to an interpolator which upsamples the signal to form a signal having sample rate $UF_{s1}$ where the upsampling factor U is a variable that is directly related to the ratio $F_{s2}/F_{s1}$. The resampler then linearly interpolates the upsampled signal to form a signal having sample rate $DF_{s2}$. Finally, the resampled signal is downsampled to form a signal having sample rate $F_{s2}$.

31 Claims, 8 Drawing Sheets

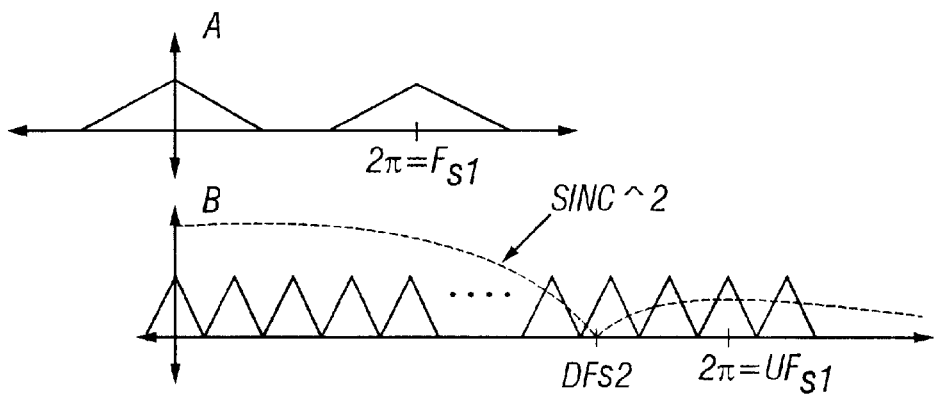
*FIG. 9A*
*FIG. 9B*
*FIG. 9C*
*FIG. 9D*
*FIG. 9E*
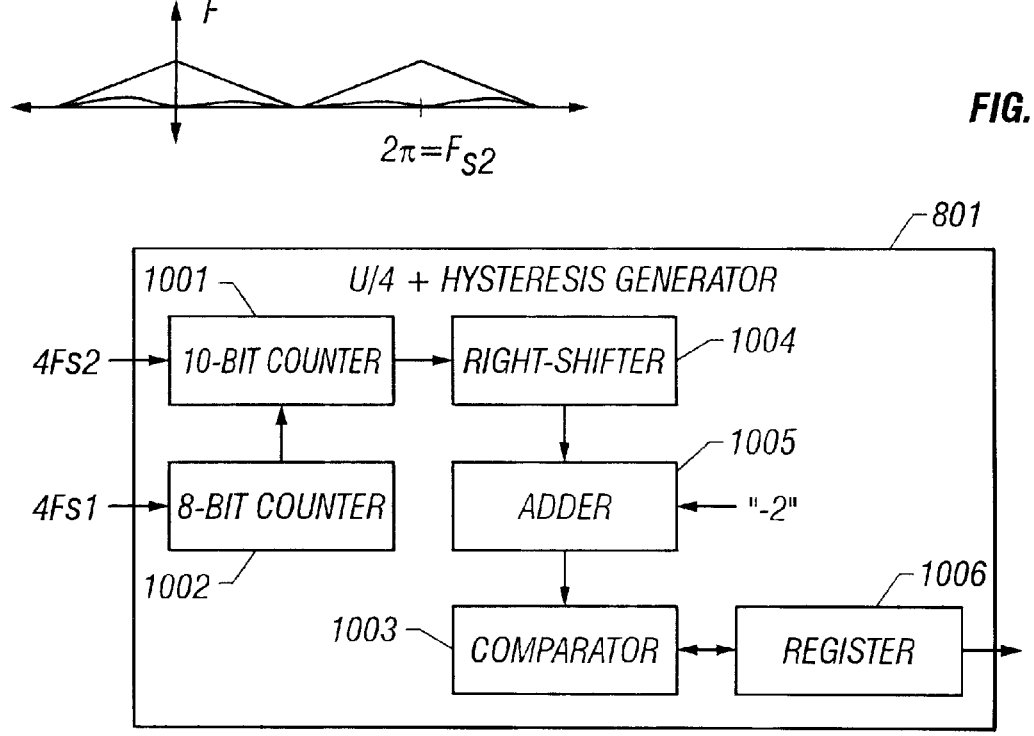
*FIG. 10*

ASYNCHRONOUS SAMPLE RATE CONVERTER

BACKGROUND OF THE INVENTION

1. Field of the Invention

The invention generally relates to digital signal processing and more particularly to a sample rate converter.

2. Description of the Related Art

As computer systems find increased applications in every day life, sample rate conversion is becoming necessary in more situations. In general, a sample rate converter (SRC) converts a digital signal having a first sample rate to a substantially similar digital signal having a second sample rate. This allows two digital processing systems operating at two different sample frequencies/rates to transfer and process each other's signals. In the audio industry, applications of an SRC are numerous given that no standard sample rate has been adopted for all applications. For example, while a sample rate of 48 kHz is generally used in compact disc (CD) recording, 44.1 kHz is used for CD playback. Similarly, while digital audio tape (DAT) generally has a sample rate of 48 kHz, motion-picture-expert-group (MPEG) and Dolby AC-3 may have sample rates of 48 kHz, 44.1 kHz, 32 kHz, or half of any of these rates. Even if two separate systems have the same nominal sampling rate, they may not share the same master clock, in which case sample rate conversion is still required.

There are three well-known methods of sample rate conversions: digital-analog-digital (DAD), synchronous, and asynchronous. The most direct method of sample rate conversion is DAD. Under the DAD method, a digital-to-analog (D/A) converter converts an input digital signal into an analog signal. The analog signal, which consists of infinitely many repetitions of a frequency spectrum centered on multiples of the sampling rate is then sent to a lowpass filter to filter out the repetitions of the frequency spectrum and leave only the baseband frequency spectrum. An analog-to-digital (A/D) converter is next used in resampling the analog signal from the A/D converter at sample rate $F_{s2}$ to convert the analog signal back into a digital signal. If $F_{s2}$ is greater than $2*(F_{s1}/2)$, Shannon's sampling theorem is met and the original signal can be reconstructed completely from the sampled signal D. The drawback of the DAD method is that it does not operate in the robust digital domain and is therefore susceptible to all the sources of error that A/D and D/A converters are susceptible to such as temperature, supply voltage, and semiconductor wafer process variations.

For the synchronous sample rate conversion method, as its name suggests, the input and output sample rates originate from a master source. In other words, the input sample rate is related to the output sample rate by a ratio of integers (e.g., 3:2). In synchronous sample rate conversion, an input digital signal, which has a sample rate $F_{s1}$ is provided as input to an interpolator. The interpolator interpolates the input digital signal by an integer factor U to increase the sample rate to that of the least common multiple (LCM) rate of the two sample rates, $F_{s1}$ and $F_{s2}$. Generally, in an interpolation operation, samples of value zero are inserted at sample times between the samples of the input signal. Since samples are added while the time span remains the same, the interpolated signal has a higher sampling rate than the input signal. The interpolated signal is next provided as input to a lowpass filter to eliminate unwanted periodic repetitions of the frequency spectrum between the frequency range $0<f<2\pi$. The lowpass filter outputs a filtered signal to a decimator which downsamples the filtered signal by an integer factor D and scales the spectral replicas at 0 and $2\pi$ to produce a signal having a sample rate of $\frac{2}{3} F_{s1}$. Accordingly, the integer factor D has a value of two (2) in this example. This method of conversion only applies to the case where the input sample rate and the output sample rate come from a master clock source.

Asynchronous sample rate conversion can convert between any two input and output sample rates. In other words, for asynchronous sample rate conversion, the ratio of the input sample rate and the output sample rate may be irrational or the ratio of the input sample rate and the output sample rate may be rational but the LCM rate is too high for synchronous sample rate conversion to be practical. In a typical Prior Art asynchronous sample rate converter such as that described in a publication titled "*Theory and VLSI Architectures for Asynchronous Sample Rate Converters,*" Robert Adams and Tom Kwan, 94th Convention of the Audio Engineering Society, Berlin, Germany, 1993, an input digital signal is first conceptually oversampled/interpolated to a very high sample rate $UF_{s1}$. Next, this high sample rate signal $UF_{s1}$ is filtered by a convolution low-pass filter before being resampled at another high rate $DF_{s2}$. The high rate signal is then downsampled by a factor of D to produce the output signal.

For a classic convolution lowpass filter, such as that described in the background section of U.S. Pat. No. 5,335,194 entitled "Sample Rate Converter" by Clayton et al. herein incorporated by reference, with a cutoff of 20 kHz operating at a sample rate $F_{s1}$ of 88.2 kHz to achieve approximately 110 dB the number of taps k required is 128. Equivalently, the number of taps k required for a sample rate $F_{s1}$ of 44.1 kHz is 64. As a general rule, the number of taps in a filter is directly proportional to the accuracy of the approximated response. Since the oversample ratio U is $2^{16}$ (65,536), the total number of taps required for upsample rate $UF_{s1}$ (where $F_{s1}$ is 44.1 kHz) is $2^{16}*64$. As such, the amount of hardware required for the number of taps and their corresponding multiplication coefficients makes implementing a convolution lowpass filter an extremely difficult task under the classic convolution design. Under the Prior Art, however, the number of taps and their corresponding coefficients are reduced to manageable levels by recognizing that only one of every D samples need be computed, since the spectrum is eventually resampled at $F_{s2}$. The number of taps k, used at any one time, is equal to the total number of taps divided by the upsampling ratio U (assuming for now $U=D=2^{16}$). For the example given above, the number of non-zero samples is 64 which is very manageable. Accordingly, the number of taps required for computation of each output sample is 64.

However, all $2^{16}*64$ coefficients still have to be stored even if only 64 of them are in use at any one time. Hence, a very large read-only-memory (ROM) is required for the above short cut. Moreover, in the short cut discussed above, the resampling introduces some aliased images into its output signal. Since no actual decimation filtering is being done, the aliased images cannot be filtered out and are somewhat magnified subsequently after downsampling. As a result, even more of a burden is put on the interpolation filter which leads to a bigger ROM and more computation.

Thus, a need exists for an apparatus, system, and method to perform sample rate conversion in an improved and economical fashion.

SUMMARY OF THE INVENTION

Accordingly, the present invention provides an apparatus, system, and method to perform sample rate conversion in an improved and economical fashion.

The present invention meets the above need with an asynchronous sample rate converter for converting a first sample rate $F_{s1}$ of a signal A(n) to a second sample rate $F_{s2}$. The sample rate converter comprises: an interpolation filter, a resampler, and a decimator connected together in series.

The interpolation filter receives as input the signal A(n) having the first sample rate $F_{s1}$. The interpolation filter upsamples the sample rate of the signal to a sample rate $UF_{s1}$, where the variable upsampling factor U is directly related to the ratio of $F_{s2}/F_{s1}$. The interpolation filter then performs interpolation between sampled values of the signal. The interpolation filter provides as output an interpolated signal B(n) having the sample rate $UF_{s1}$.

The resampler receives as input the interpolated signal having sample rate $UF_{s1}$ from the interpolator. The resampler resamples the signal by linear interpolation at a predetermined multiple, D, of the second sample rate $F_{s2}$ as a sample rate. The resampler provides as output the signal having the sample rate $DF_{s2}$.

The decimation filter receives as input the signal having the predetermined sample rate $DF_{s2}$ as a sample rate. The decimation filter downsamples the predetermined sample rate $DF_{s2}$ to the second sample rate $F_{s2}$.

All the features and advantages of the present invention will become apparent from the following detailed description of its preferred embodiment whose description should be taken in conjunction with the accompanying drawings.

BRIEF DESCRIPTION OF THE DRAWINGS

FIGS. 9A–9E illustrate the frequency spectrum of signals A–F in accordance with the present invention.

FIG. 10 is a block diagram illustrating U/4 and hysteresis generator circuit 802 inside rate estimator 503 to generate the variable U/4 factor according to equation (4).

DETAILED DESCRIPTION OF THE INVENTION

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail as not to unnecessarily obscure aspects of the present invention.

Figure 1:
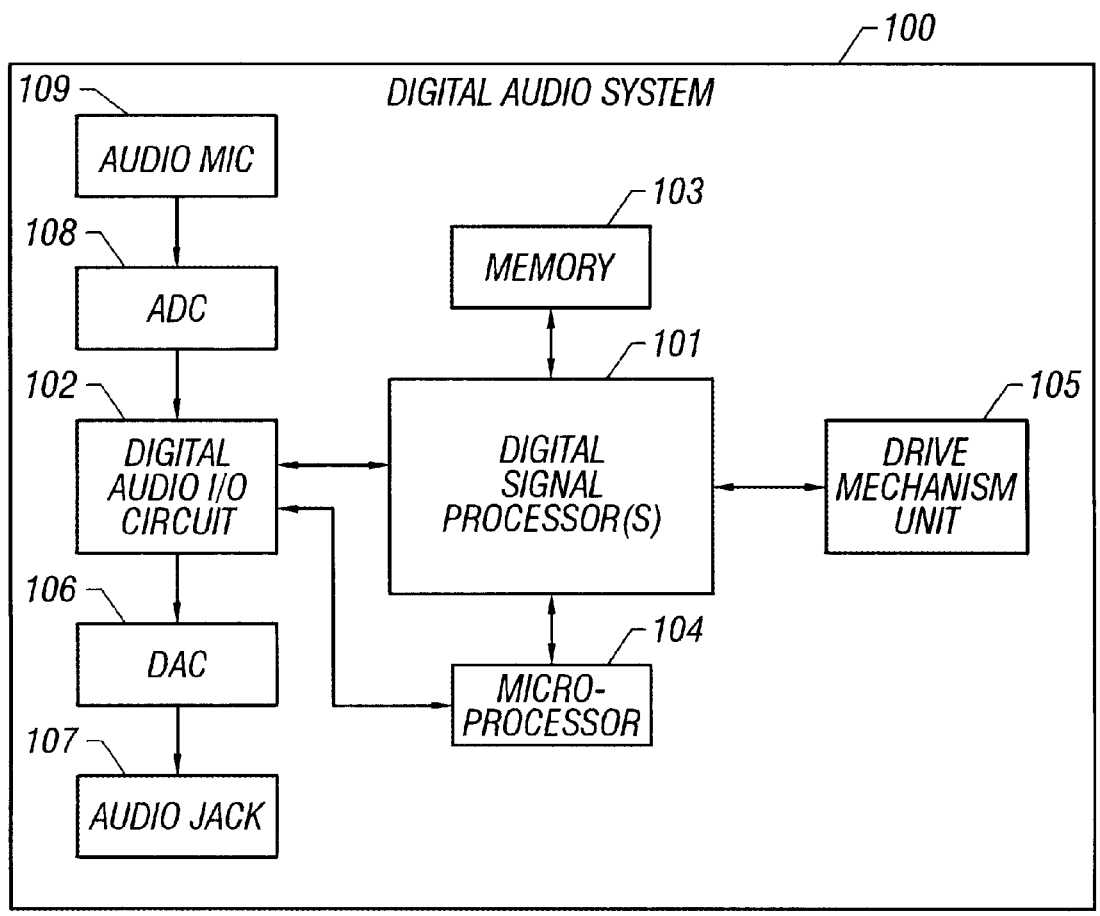
FIG. 1 is a block diagram illustrating a typical digital audio system using the present invention.

Reference is made to FIG. 1 illustrating an overview of a generalized digital audio system 100 in accordance with the present invention. Digital audio system 100 can be a Compact Disk (CD) player/recorder system, a Digital Audio Tape (DAT) system, a magnetic drive (MD) system, a video tape recorder (VTR) system, or others. As shown in FIG. 1, Digital audio system 100 comprises at least one digital signal processor 101, digital audio input/output (I/O) circuit 102, memory 103, processor/controller 104, drive mechanism unit 105, digital-to-analog (DAC) converter 106, audio jack 107, analog-to-digital (ADC) converter 108, and audio microphone 109.

Drive mechanism unit 105 includes a spindle motor to rotate the data storing medium (e.g., CD or magnetic tape) past read and record heads which respectively retrieve and record information from/to the data storing medium. To control the speed and position of the data storing medium, drive mechanism unit 105 implements a drive mechanism controller which, for example, may monitor the motor spindle revolution count and in response may generate pulse signals indicative of the revolution count. The pulse signals are subsequently utilized to control the spindle motor speeds and to determine amount of data storing medium played or recorded.

During a read operation, the read heads generate read signals in response to data pulses retrieved from the data storing medium. The read signals are subsequently sent to an amplifier prior to being provided as input to digital signal processor 101. On the other hand, during a record operation, digital signal processor 101 sends write data signals to drive mechanism unit 105 which in turn utilizes the record heads to rite the data onto the data storing medium. It should be clear to a person of ordinary skill in the art that drive mechanism unit 105 is well-known and obvious.

Digital signal processor 101 may comprise a demodulator, a modulator, a decoder, and an encoder (all not shown). Digital signal processor 101 is normally operated under the control of uprocessor/controller 104. In a read operation, the amplified read signals from drive mechanism unit 105 is first stored in memory 103. By staying in communications with digital signal processor 101, memory 103, and drive mechanism unit 105, uprocessor/controller 104 determines when to supply the stored read signals to the demodulator for processing. The modulator provides an output having a serial bit stream that includes audio data and non-audio information. The output of the demodulator is subsequently provided to the decoder which provides, for example, error correction code (ECC) processing on the demodulated signals as well as decomposes the demodulated serial data into audio data and non-audio information. The output of the decoder is then provided as an input to digital audio I/O circuit 102 for processing. Conversely, in a write operation, the write signals from digital audio I/O circuit 102 is first stored in memory 103. By staying in communications with digital signal processor 101, memory 103, and drive mechanism unit 105, uprocessor/controller 104 determines when to supply the stored write signals to the modulator which combines the audio data and non-audio information together into subframes, frames, and blocks that conform to the AES/IEC-60958 format. The modulator's output is supplied to the encoder which encodes the signals in the biphase-mark format for transmitting to mechanism drive unit 105.

Digital audio I/O circuit 102 is used as a transceiver with asynchronous sample rate converter which allows the user to specify the output sample rate of the digital audio information received. Digital audio I/O circuit 102 converts the input sample rate $F_{s1}$ of the digital audio information to an output sample rate $F_{s2}$. Digital audio I/O circuit 102 is one place where the present invention may be incorporated. Digital audio I/O circuit 102 can transmit processed digital audio data with the new sample (i.e., output) rate $F_{s2}$ received from drive mechanism unit 105 via digital signal processor 801 to DAC 106 to be converted into analog signal for outputting at audio jack 107. Digital audio I/O circuit 102 can also receive analog signals from audio microphone 809 which is then converted into digital data stream using ADC 108. The converted digital data can then be sent to digital audio I/O circuit 102 to convert the sample rate and subsequently send to digital signal processor 101 for further processing prior to being sent to drive mechanism unit 105 to write onto the data storing medium.

Figure 2:
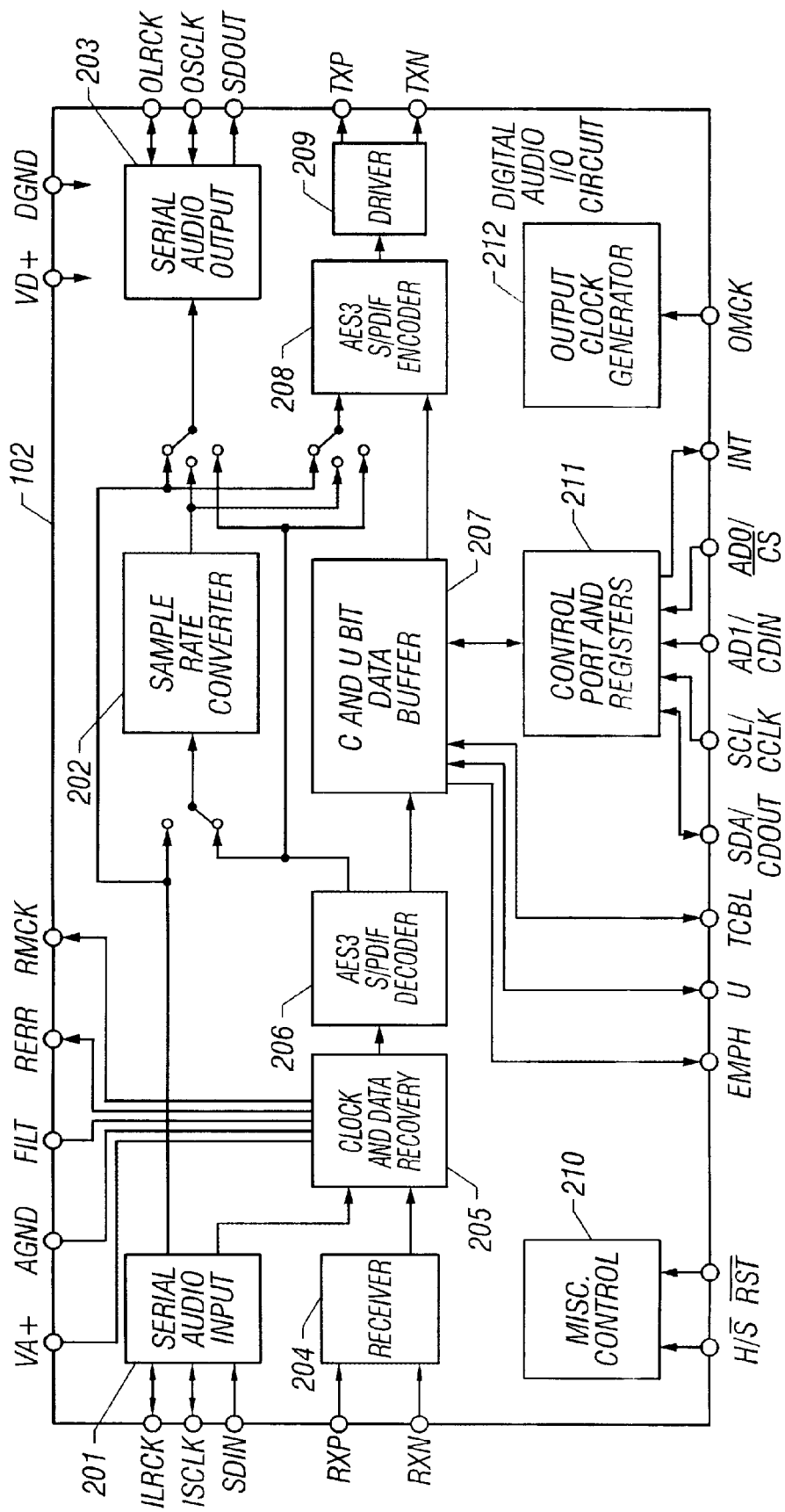
FIG. 2 is a block diagram illustrating the digital audio I/O circuit 102 of FIG. 1.

FIG. 2 illustrates in more detail digital audio I/O circuit 102. In general, digital audio I/O circuit 102 comprises serial audio input circuit 201, sample rate converter (SRC) 202, serial audio output circuit 203, receiver 204, clock & data recovery circuit 205, AES3 S/PDIF decoder 206, C & U data buffer 207, AES3 S/PDIF encoder 208, driver 209, miscellaneous controller 210, control port & registers 211, and output clock generator 212.

As shown in FIG. 2, signals input left/right clock (ILRCK) (a.k.a. frame clock), input serial clock (ISCLK), and serial data input (SDIN) from a 3-wire serial format audio source are provided as inputs to serial audio input circuit 201. Serial data stream SDIN contains data for both left and right channels in an interleaved format. Typically, when signal ILRCK is HIGH, a sample of the left channel signal is presented. Otherwise, when signal ILRCK is LOW, a sample of the right channel signal is presented. Hence, the frequency of frame clock ILRCK is equal to the sampling rate $F_1$ of the left and right channel PCM (Pulse Code Modulation) data. Serial clock signal ISCLK is typically an integer multiple of the left/right clock such as 32× or 64× $F_{s1}$. Serial audio input 201 latches data from the serial data stream input to ensure that the same data is available for at least an ILRCK clock cycle. The output of serial audio input circuit 201 is made available as an input to sample rate converter 202 which converts the sample rate of the audio data from $F_{s1}$ to $F_{s2}$ and in turn makes its output available to serial audio output circuit 203 and AES3 S/PDIF encoder 208. The output of serial audio input circuit 201 is also made available as an input directly to serial audio output circuit 203 and AES3 S/PDIF encoder 208 thereby bypassing sample rate converter 202. In so doing, the sample rate of the serial audio data stream input can be changed from $F_{s1}$ to $F_{s2}$ by sample rate converter 202 or be left unchanged depending on the data path which is selectable by the user.

Digital audio I/O circuit 102 is also designed to be compatible with AES/IEC-60958 format type audio input signals. As shown in FIG. 2, differential line input signals RXP and RXN carrying AES/IEC-60958 format type data (a.k.a., biphase-mark format data) are provided as input to receiver 204.

Receiver 204 latches biphase-mark format data to ensure that the same data is available for at least 1/128 of a frame period, or 1 IU. The output of receiver 204 as well as the output of serial audio input circuit 201 are provided to clock & data recovery circuit 205. The clock recovery function of clock & data recovery circuit 205 is to recover a high-frequency, low-jitter RMCK, given a low frequency input clock. Such function is achieved with a phase-locked loop (PLL) (not shown). The low frequency input can either be the $F_{s1}$ ILRCK, or a clock derived from the biphase-mark data of receiver 204. Circuit 205 also decodes the biphase-mark data from incoming AES frames into a 1-bit serial data stream, with a data rate $64F_{s1}$.

Master clock output signal RMCK and PLL filter signal FILT are output by the PLL which consists of phase and frequency detectors, a second-order loop filter, and a voltage controlled oscillator (VCO). Since most data jitters introduced by digital audio data signals are high in frequency, the PLL is designed to strongly attenuate at high frequency. Frequency detectors are used to minimize the amount of time required for the PLL to lock to the incoming data stream and to prevent false lock conditions. When the PLL is not locked to the incoming serial audio data stream, the frequency detectors pull the VCO frequency within the lock range of the PLL. When no digital audio data is present, the VCO frequency is pulled to its minimum value. Receive error indicator signal RERR indicates the presence of a problem of the receiver such data validity, parity error, bi-phase coding error, confidence, and code correction (CRC) errors, as well as the loss of lock in the PLL. The PLL Master clock output signal RMCK is $256 \times F_{s1}$ and is the output of the VCO. Clock signal RMCK provides a sample rate for synchronization purpose by clock & data recovery circuit 205.

The clock and data recovered from clock & data recovery circuit 205 is provided to AES3 S/PDIF decoder 206 which decodes and separates the binary information into audio and non-audio components. The non-audio components include validity (V), user (U), channel status (C), parity (P) bits. The U and C non-audio bit streams are provided as inputs to C & U bit data buffer 207. The audio data is made available as an input to sample rate converter 202 which converts the sample rate of the audio data from $F_{s1}$ to $F_{s2}$ and in turn makes its output available to serial audio output circuit 203 and AES3 S/PDIF encoder 208. The output of AES3 S/PDIF decoder 206 is also made available as an input directly to serial audio output circuit 203 and AES3 S/PDIF encoder 208 thereby bypassing sample rate converter 202. In so doing, the sample rate of the serial audio data stream input can be changed from $F_{s1}$ to $F_{s2}$ by sample rate converter 202 or be left unchanged depending on the data path which is selectable by the user.

C & U bit data buffer 207 assembles the non-audio information stream bits U and C in the desired formats/structures as well as converts their sample rate from $F_{s1}$ to $F_{s2}$. Control Port & Registers circuit 211 acts as an interface between C & U bit data buffer 207 and uprocessor 104, allowing the uprocessor 104 to transfer data, address, and control signals needed to carry out the above tasks. Control Port & Registers circuit 211 is connected to serial control data I/O ($I^2C$)/data out (SPI) signal SDA/CDOUT, control port clock signal SCL/CCLK, address bit 1 ($I^2C$)/serial control data in (SPI) signal AD1/CDIN, address bit 0 ($I^2C$)/control port chip select in (SPI) signal AD0/CS, and interrupt signal INT. Signal INT indicates errors and key events during operation of digital audio I/O circuit 102. All bits effecting INT are maskable via a control register. The conditions that initiate interrupts are readable via a control register in control port & registers 211.

C & U bit data buffer 207 provides the assembled non-audio information with a new sample rate $F_{s2}$ as output to AES3 S/PDIF encoder 208. The outputs of serial audio input circuit 201, sample rate converter 202, and AES3 S/PDIF decoder 206 are also made available to AES3 S/PDIF encoder 208. In so doing, depending on the mode selected by the user, AES3 S/PDIF encoder 208 can encode audio data and non-audio information into an AES/IEC-60958 data stream to be transmitted by driver 209 over differential line driver output signals TXN and TXP.

In addition to inputs from serial audio input circuit 201 and sample rate converter 202, serial audio output circuit 203 also receives an input from AES3 S/PDIF decoder 206. Depending on the mode selected by the user, serial audio output circuit 203 allows the appropriate inputs to pass through as serial digital audio outputs with serial audio output port left/right clock output signal OLRCK, serial audio output port bit clock output signal OSCLK, or serial audio output port data output signal SDOUT. While the signal OLRCK carries the word rate clock for audio data at sample rate $F_{s2}$, the signal OSCLK carries the serial bit clock for audio data.

Miscellaneous controller 212 performs hardware-software mode switching and power control tasks for digital audio I/O circuit 102. Miscellaneous controller receives control hardware or software control mode select signal H/S and reset input signal RST as input. If H/S signal is HIGH, the method of controlling the operating mode of digital audio I/O circuit 102 is hardware and device control and data access are provided by pins. On the other hand, if H/S signal is LOW, device control and data access are primarily via the control port using a microcontroller. When signal RST is LOW, digital audio I/O circuit 102 enters a low power mode and all internal states are reset. Output clock generator 213 receives as input output section master clock input signal OMCK and provides as output an output clock signal whose frequency must be 256×, 384×, or 512× the output sample rate $F_{s2}$.

Figure 3:
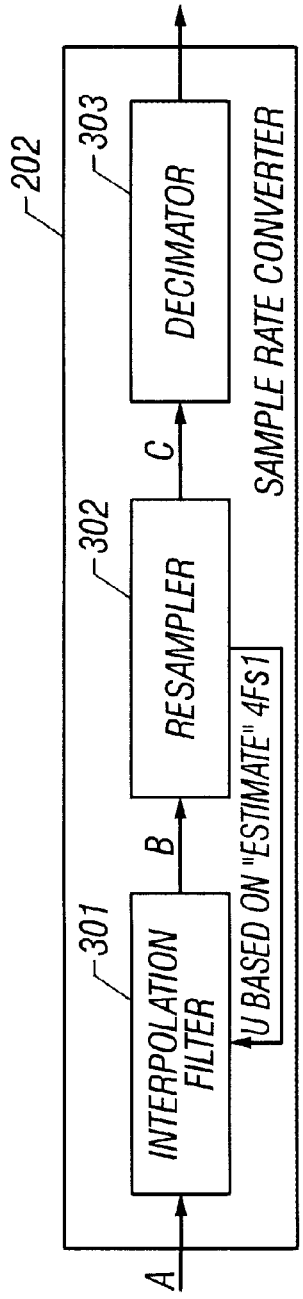
FIG. 3 is a block diagram illustrating asynchronous sample rate converter 202 of FIG. 2 in accordance with the present invention.

Referring now to FIG. 3 which illustrates an overall block diagram of asynchronous sample rate converter 202 implemented as part of digital audio I/O circuit 102 to handle audio signals of different asynchronous sample rates. In general, sample rate converter 202 converts the sample rate $F_{s1}$ of an input audio digital signal A to a different sample rate $F_{s2}$ while maintaining the data content of the input audio signal. This allows digital audio I/O circuit 102 to process input audio digital signals A having a different sample rate from the operating sample rate of digital audio I/O circuit 102. As shown in FIG. 3, asynchronous sample rate converter 202 of the present invention comprises interpolation filter 301, resampler 302, and decimator 303 which are connected together in series. In brief, digital signal A having sample rate $F_{s1}$ is provided as input to interpolation filter 301 which upsamples signal A by a factor of U based on the feedback "ESTIMATE" $4F_{s1}$ from resampler 302 and then lowpass filters the upsampled signal. Interpolation filter 301 outputs filtered interpolated signal B having an unsampled rate a $F_{s1}$ to resampler 302 which calculates the upsampling value U and provides U as feedback to interpolation filter 301 for use in the upsampling. Additionally, resampler 302 linearly interpolates the filtered signal and resamples signal B to form signal C having a sample rate $DF_{s2}$. Decimator 303 then reduces the sample rate $DF_{s2}$ by a factor of D to produce signal Z having sample rate $F_{s2}$.

Figure 4:
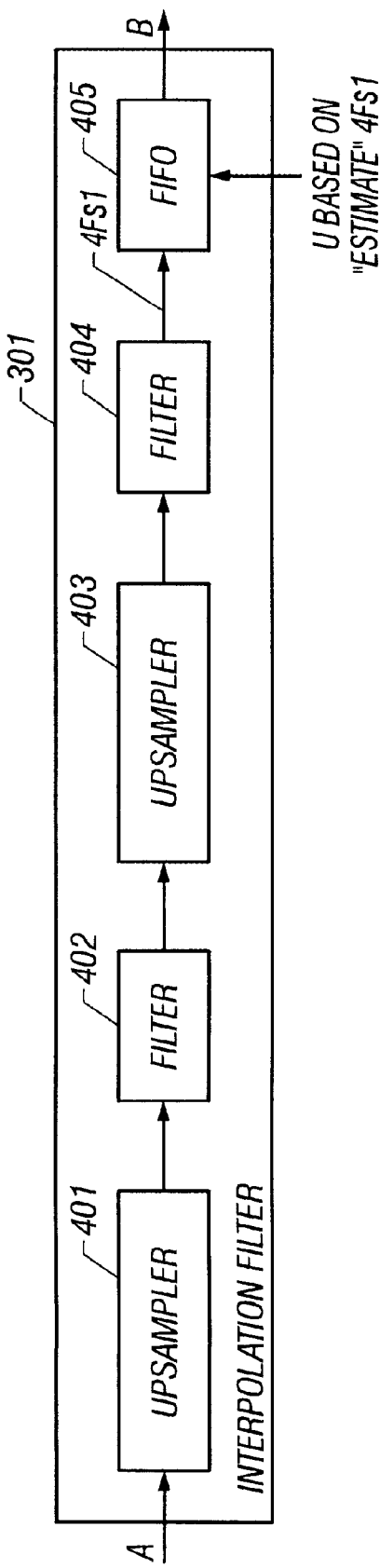
FIG. 4 is a block diagram illustrating interpolation filter 301 of FIG. 3.

Reference is now made to FIG. 4 illustrating a block diagram of interpolation filter 301 in accordance with the present invention. Interpolation filter 301 comprises upsampler 401, filter 402, upsampler 403, and filter 404 and FIFO buffer 405. In general, interpolation filter 301 helps filtering out undesirable overlapping images that are introduced during upsampling from $F_{s1}$ to $UF_{s1}$. Because the decimation filter is unable to separate the baseband signal and the images at or below its cutoff frequency, interpolation filter 301 is used to filter out these images during interpolation (e.g., from the start). Hence, interpolation filter 301 is designed to always remove the overlapping images created by the upsampling process. The number of images which must be removed is determined by the maximum $F_{s2}/F_{s1}$ ratio. Interpolation filter 301 performs the upsampling in multiple stages to decrease the hardware needed to perform the multiplication operations during upsampling.

Accordingly, in the present invention, upsampler 401 is used to initially upsample the rate $F_{s1}$ of input signal A by a factor of two (2). The output of upsampler 401 is then filtered to eliminate redundant images by filter 402 which is a low pass filter having a cutoff frequency of $F_{s1}/2$. The output of filter 402 is provided as input to upsampler 403 which upsamples the rate of its input signal by a factor of 2. Next, filter 404 is used to further eliminate redundant images to produce the desired spectrum at $4F_{s1}$. The output signal of filter 404 is then provided to FIFO buffer 405.

Figure 5:
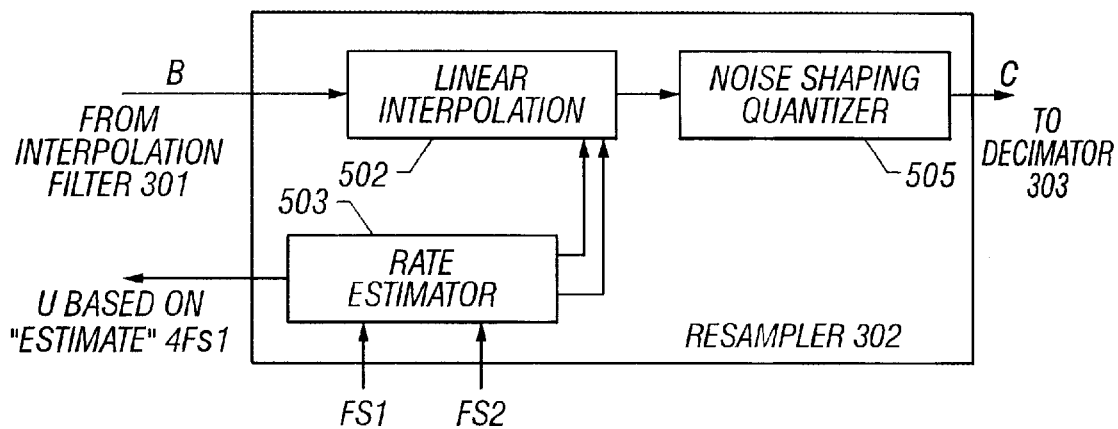
FIG. 5 is a block diagram illustrating resampler 302 of FIG. 2.

FIFO buffer 405 is used to buffer data of the output signal from upsampling filter 404. FIFO buffer 405 is necessary to zero-order hold the data by a factor of U/4 and retime it to an output-time base 128 $F_{s2}$ before presenting it to resampler 302. Preferably, data is written into FIFO buffer 405 at a sampling clock rate of $4F_{s1}$. On the other hand, data is read from FIFO buffer 405 at an "estimate" sampling clock rate of $4F_{s1}$. The "estimate" sampling clock rate is generated by rate estimator 503 which is discussed in more details below. Hence, FIFO buffer 405 compensates for the difference between $4F_{s1}$ and the "estimate" of $4F_{s1}$. It is clear that the components of interpolation filter 301 is well-known to a person of ordinary skill in the art. Output signal B (having unsampled rate $UF_{s1}$) of FIFO buffer 405 is then provided to resampler 302 which performs linear interpolation on the signal B, calculates the value U/4, and resamples the signal B at the sample rate $DF_{s2}$. Accordingly, as shown in FIG. 5, resampler 302 consists of linear interpolator 502, rate estimator 503, and noise shaping quantizer 504. Linear interpolator 502 carries out the interpolation function on output signal B received from FIFO buffer 405.

Figure 6:
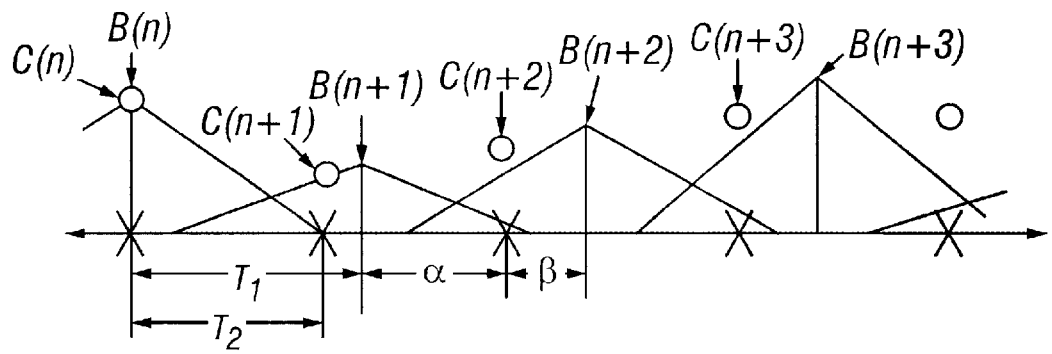
FIG. 6 illustrates the result of the superposition of signal A onto the linear interpolation function H to form the linearly interpolated signal B as expressed by equation (2).

Generally, linear interpolation is carried out by applying an interpolation function to input signal B. The effect of applying an interpolation function following an upsampling operation is to fill in the values of the continuous-time function between the sample points. Hence, linear interpolator 502 is designed to transform input signal B to signal C which is represented by the following equation:

$$C(n)=B(n)\,(1-a(n)/T2)+B(n+1)\,(1-T1/T2+a(n)/T2) \qquad (2)$$

where B(n) is the value of signal B at the sample time n=0, 1, 2, 3, ..., B(n+1) is the value of signal B at the immediate following sample time (n+1), T1 is the sample period corresponding to sample rate $UF_{s1}$, T2 is the sample period corresponding to sample rate $128F_{s2}$, and a(n) is the relative phase between B(n) and B(n+1). Function C(n) is illustrated as an example in FIG. 6. As shown in FIG. 6, the equation C(n) is the result of signal B superimposing on the linear interpolation function h(t).

In conventional linear interpolation approaches, T2 is replaced with T2. In so doing, zeros are placed in the frequency spectrum of signal B(n) at multiples of UFs1. However, in accordance to the present invention, the fundamentally new idea reflected in equation (2), which reduces the stopband requirements of interpolation filter 301, is to notice that upon resampling to DFs2, only images of the original baseband signal near kDFs2 (k=1, 2, 3 . . . ) will alias into the baseband of the final output of the sample rate converter. Therefore, only the spectrum near kDFs2 requires attenuation with the decimation filter after resampling. The attenuation of the spectrum near kDFs2 is accomplished by placement of zeros at kDFs2. This is implemented by equation (2).

As shown in FIG. 6, because T2<T1, there are only two multiplication operations in function C(n). On the other hand, if T2>T1, the overlaps of signal B spectrum will require more than two multiplication operations to determine any value of function C(n) above. Hence, it is important that T2 is less than T1.

Mathematically, function C(n) can be derived by performing a limited convolution operation between signal B and the following linear interpolation function:

$$h(t) = 1 - |t|/T2 \quad \text{for} \ -T2 \le t \le T2 \quad (3)$$
$$= 0 \quad \text{otherwise}$$

Figure 7:
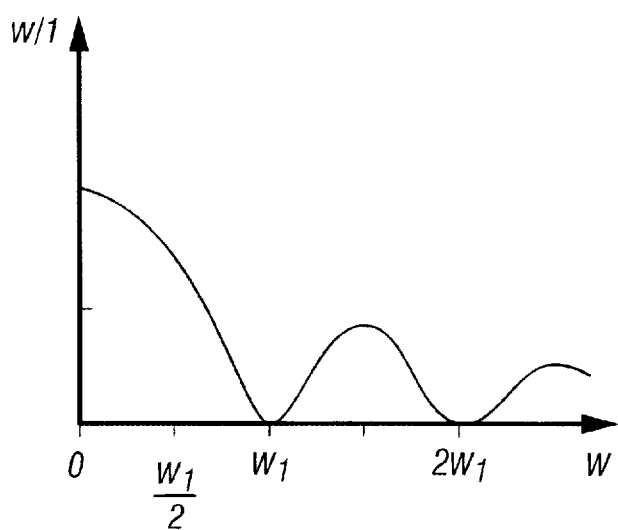
FIG. 7 illustrates the frequency spectra of a $sinc^2$ function.

The linear interpolation function (3) is an approximation of the ideal linear interpolation function and is graphically represented by back-to-back right triangles with a base to $2T_2$. The ideal linear interpolation function is a $sinc^2$ function (e.g., $((sin(\pi f/DF_{s2}))/(\pi f/DF_{s2}))^2$). This is compared to the ideal interpolation function of a zero-order hold interpolator. The ideal interpolation function of a zero-order hold interpolator is a sinc function (e.g., $(sin(\pi f/DF_{s2}))/(\pi f/DF_{s2}))$. As is well known in the art, the frequency spectrum of a sinc function has a much more gradual slope than that of a $sinc^2$ function. FIG. 7 illustrates the frequency spectrum of $sinc^2$ function. For this reason, in performing a linear interpolation between points, the desired performance of the overall sample rate converter 202 (e.g., 100 dB attenuation of aliased artifacts) can be achieved at a substantially lower oversample rate. Consider the following example, where the frequency spectrum of the interpolator has a baseband of −20 Hz<F<20 kHz. For an attenuation of 100 dB or better, the required downsampling factor D for a zero-order-hold interpolator can be determined by solving the sinc function $((sin(\pi f/DF_{s2}))/(\pi f/DF_{s2})$ for down sampling factor D where $f=DF_{s2}\pm 20$ kHz. Similarly, for an attenuation of 100 dB or better, the required downsampling factor D for a linear interpolator can be determined by setting f to $DF_{s2}\pm 20$ kHz and solving the $sinc^2$ function $((sin(\pi f/DF_{s2}))/(\pi f/DF_{s2}))^2)$ for down sampling factor. Because of the square power in the $sinc^2$ function, the downsampling factor D calculated from the sinc function is greater than the downsampling factor D calculated from the $sinc^2$ function. Hence, while a zero-order hold interpolator may require a downsampling factor of $2^{16}$, a linear interpolation interpolator may only require a downsampling factor of 28.

For ease of hardware implementation, it is desirable to reduce the downsampling factor required (e.g., $2^8$) for a linear interpolator through variable interpolation. In general, variable interpolation involves varying the upsampling factor U and/or the downsampling factor D to ensure that $DF_{s2}$ is not equal to or nearly equal to $UF_{s1}$. The rationale behind the concept of variable interpolation is demonstrated, as examples, using FIGS. 9A–9E. As shown in FIG. 9A, the frequency spectrum of a signal A has images centered at the multiples of sample rate $F_{s1}$. In FIG. 9B, signal A is upsampled by a factor U to produce signal B having a sample rate of $UF_{s1}$ which translates to more images along the same span. There is a full image at sample rate $nUF_{s1}$ where n=1, 2, 3. When signal B is combined with the $sinc^2$ linear interpolation function in a convolution with the triangles of base width 2T2 in the time domain, the zeros of the $sinc^2$ linear interpolation function at $DF_{s2}$ are placed at $nDF_{s2}$ where n=1, 2, 3. If $DF_{s2}$ is close to $UF_{s1}$, the zero of $sinc^2$ function must attenuate substantially the full image centered at $UF_{s1}$ which translates to requiring at least an upsampling factor of 28. However, if it can be controlled so that $DF_{s2}$ is never near the full image centered at $UF_{s1}$, the downsampling factor can be relaxed to 26 or 27. Moreover, as discussed earlier, since it is a computational advantage to keep T2<T1 (or $1/DF_{s2}<1/UF_{s1}$), $DF_{s2}$ is preferably kept more than $UF_{s1}$.

Figure 8:
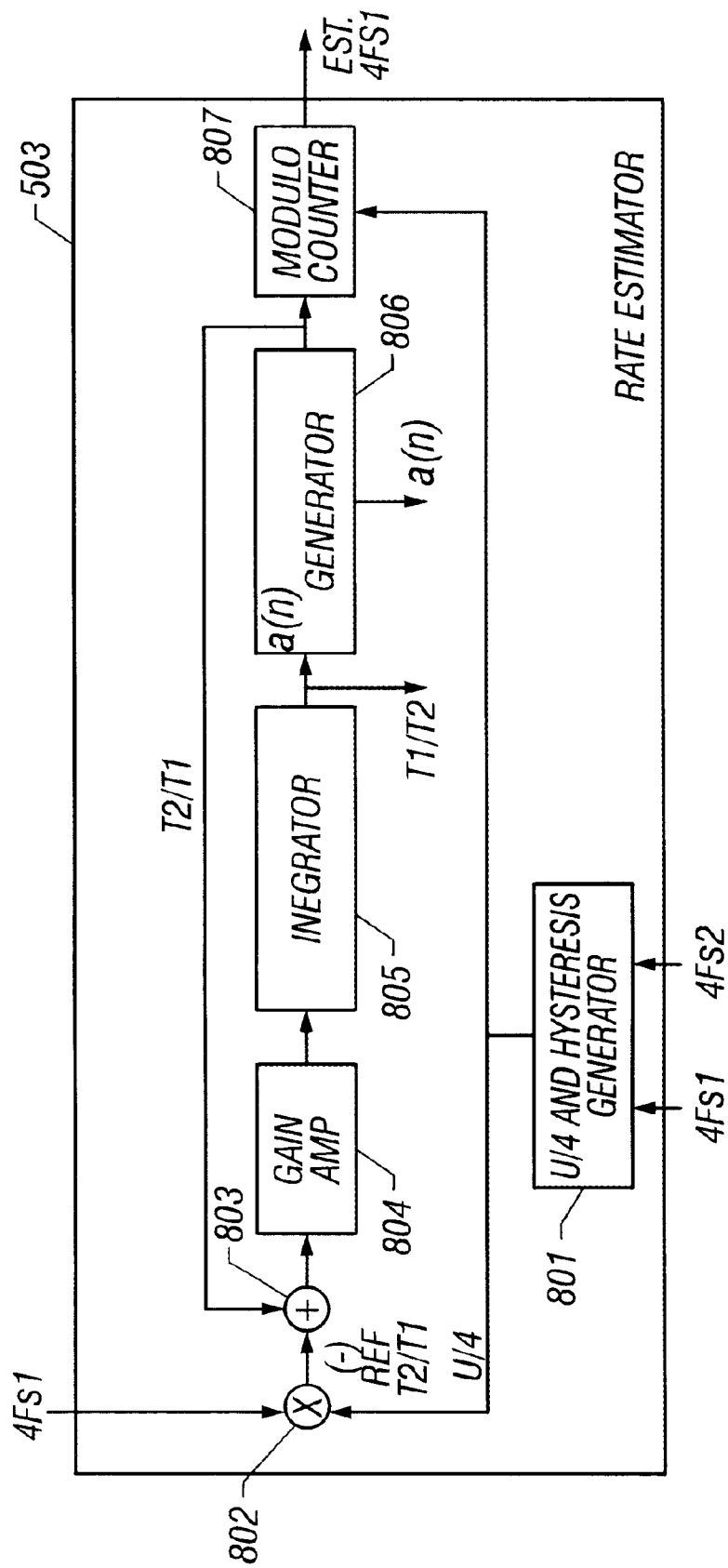
FIG. 8 is a block diagram illustrating rate estimator 503 of FIG. 5 in accordance to the present invention.

Referring now to FIG. 8 rate estimator 503 is illustrated. Rate estimator 503 generates an estimate of sampling rate $4F_{s1}$ for FIFO buffer 501 and values a(n) and T1/T2 for linear interpolator 502. Linear interpolator 502 in turn uses a(n) and T1/T2 to perform linear interpolation on the signal B. In the preferred embodiment, rate estimator 503 comprises U/4 & hysteresis generator 801, multiplier 802, adder 803, gain amplifier 804, integrator 805, a(n) generator 806, and modulo counter 807.

In the preferred embodiment, variable interpolation is implemented by varying the upsampling factor U. In general, this is done by changing the length of the zero-order-hold factor U/4. As discussed above, assume that the downsampling factor D is $2^7$ (128). Then to ensure that the upsampling rate $UF_{s1}$ is not close to the downsampling rate $DF_{s2}$, the factor U/4 is calculated according to the following equation:

$$U/4 = \text{Floor}(32(F_{s2}/F_{s1})-2) \quad (4)$$

wherein the Floor function means the greatest integer less than. Hence, according to equation (4), the value of U is maintained such that $UF_{s1}$ is less than $128F_{s2}$. This is advantageous for reasons discussed above. It should be clear to a person of ordinary skill in the art that equation (4) can be generalized to be applicable to any upsampling factor U and downsampling factor D as follows:

$$U/4 = \text{Floor}((D/4)*(F_{s2}/F_{s1})-2) \quad (4a)$$

wherein the upsampling factor U is maintained such that $UF_{s1}$ is less than $DF_{s2}$.

FIG. 10 illustrates an embodiment of U/4 & hysteresis generator 801 to generate the variable U/4 factor according to equation (3) above. As shown in FIG. 10, variable U/4 generator 801 comprises counter 1001, counter 1002, comparator 1003, shifter 1004, adder 1005, and register 1006. Frequencies $4F_{s1}$ and $4F_{s2}$ are respectively provided as input simultaneously to counters 1002 and 1001 which monitor the frequency count. Counters 1001 and 1002 are of different sizes. Preferably, counter 1001 is a 10-bit counter and counter 1002 is an 8-bit counter. Because they are different in sizes and because counters 1001 and 1002 operate synchronously, when counter 1002 overflows and resets, the value of counter 1001 represents the ratio $256F_{s2}/F_{s1}$. Hence, when counter 1002 overflows, it sends a signal to counter 1001. The current count of counter 1001 is then sent as input to binary shifter 1004 which in-turn right-shifts its content by 3 bits thereby dividing its content by a factor of 8. Shifter 1004 only keeps the upper 7 bits of the result by truncating the lower 3 bits to implement the Floor function. Shifter 1004 outputs its result to adder 1005 which adds a value "−2" to the result outputted by shifter 1004. This is the value U/4 as indicated in equation (4) above.

However, to disallow small changes in $F_{s1}$ and $F_{s2}$ that would effect the value U/4, additional hardware is incorporated to compensate for these small changes. In this scheme, the U/4 value outputted from adder 1005 is stored in register 1006 via comparator 1003 as the "old" U/4 value. A "new" updated U/4 value is then calculated. The "old" U/4 value stored in register 1006 is then compared with the "new" U/4 value from adder 1005. If comparator 1003 determines that the "old" U/4 value differs from the "new" U/4 value by two or more, then the "new" U/4 is stored in register 1006. Otherwise, the "old" U/4 value remains stored inside register 1006 and the process continues. In doing so, a hysteresis is built in to ensure that the value U/4 is fixed and does not continually oscillate about a nominal value.

Referring now back to FIG. 8 illustrating rate estimator 503. The value U/4 generated by U/4 & hysteresis generator 801 is provided to multiplier 802 which multiplies the value U/4 by a sampling clock rate $4F_{s1}$. In so doing, multiplier 802 produces a reference T2/T1 ratio wherein $T2=1/DF_{s2}$ and $T1=1/UF_{s1}$. In other words, $T2/T1=UF_{s1}/DF_{s2}$. The reference T2/T1 ratio together with one output of a(n) generator 806 is then provided to adder 803 as inputs. The output of a(n) generator 806 provides an actual T2/T1 ratio extracted from the previous clock cycle.

Adder 803 determines the error signal which is indicative of the difference between the reference ratio T2/T1 and the actual ratio T2/T1. As a result of the actual ratio T2/T1 feedback loop, errors introduced due to different data transfer rates $4F_{s1\ and\ DFs2}$ can be attenuated thereby making the equation $T2/T1=UF_{s1}/DF_{s2}$. The error signal is provided as an input to gain amplifier 804 which provides the desired gain factor to the error signal. Gain amplifier 804 outputs the error gain signal to integrator 805. Mathematically, integrator 804 can be represented by the function $z^{-1}/(1-z^{-1})$ which when applied to the error gain signal in the context of FIG. 8 results in an output ratio of T1/T2. Output ratio T1/T2 is supplied as an input to a(n) generator 806 as well as linear interpolator 502.

As discussed earlier, linear interpolator 502 is designed to transform input signal B to signal C which is represented by equation (2). Equation (2) indicates that the value a(n)/T2 where n=0, 1, 2, 3, . . . must be calculated in computing signal C. The value of a(n) is the time period between the sampled value B(n) of signal A and the value B(n+1) of signal B. From FIG. 6, it can be shown that:

$$a(n)=nT2-T1*\text{Floor}(nT2/T1) \quad (5)$$

where the function Floor means the greatest integer less than and n=0, 1, 2, 3, . . .

From this equation, it can further be shown that:

$$a(n+1)=a(n)+T2-T1*\text{Floor}((a(n)+T2)/T1) \quad (6)$$

Figure 11:
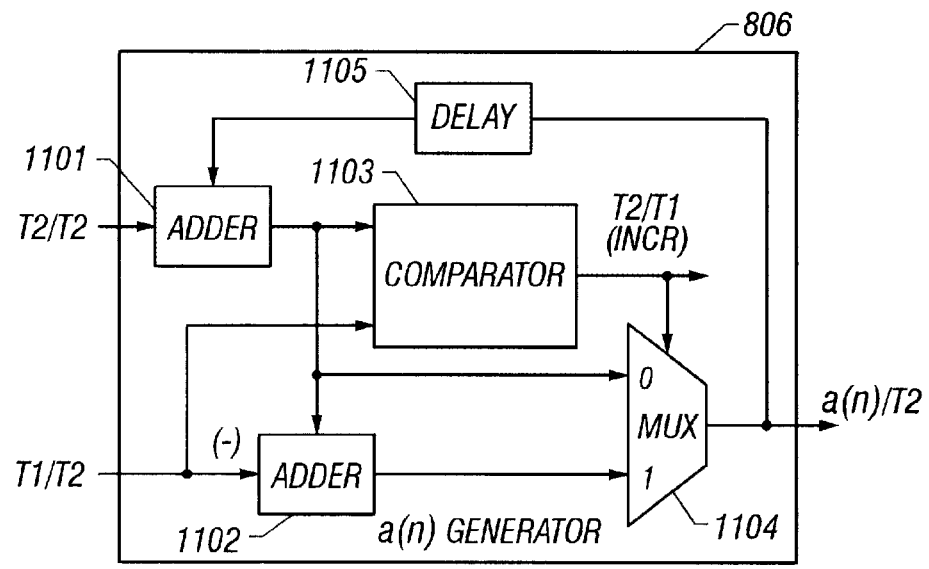
FIG. 11 is a block diagram illustrating a(n) generator circuit 806 inside rate estimator circuit 503 to generate the time difference a(n)/T2.

Reference is now made to FIG. 11 illustrating the preferred embodiment of a(n) generator 806. In general, a(n) generator 806 implements equations (5) and (6) above. Since the value a(n)/T2 is computed, all the components of equations (5) and (6) are also normalized to T2. The a(n) generator 806 consists of adder 1101, adder 1102, comparator 1103, multiplexer 1104, and delay circuit 1105. More particularly, adder 1101 receives as input the value "1" (T2/T2) and the output of delay circuit 1105 which is a(n−1)/T2. The output of adder 1101 is provided as input to comparator 1103 and adder 1102. Adder 1102 and comparator 1103 also receive as input the value -T1/T2. Comparator 1103 determines whether the output of adder 1101 is greater than the value T1/T2. If the output of adder 1101 is greater than the value T1/T2, comparator 1103 outputs a HIGH signal. Otherwise, comparator 1103 outputs a LOW signal. The output of comparator 1103, which is referred to as INCR signal, is used to indicate whether a new sample of B(n) is necessary. Adder 1102 adds the value -T1/T2 from the output of adder 1101 and outputs this value to multiplexer 1104 which also receives as input the output of adder 1101. INCR signal is provided to multiplexer 1104 to control its output. If INCR signal is HIGH, multiplexer 1104 outputs the output of adder 1102. If INCR signal is LOW, multiplexer 1104 outputs the output of adder 1101. The output of multiplexer 1104 is a(n)/T2. The output of multiplexer 1104 is provided to delay circuit 1105 which delays the output a(n)/T2 by one clock cycle before sending the delayed signal a(n−1)/T2 to adder 1101.

To illustrate the operational steps of a(n) generator 806, consider the following example in which T1=4 and T2=3. Initially, the output of delay circuit 1105 is zero. Adder 1101 adds the value "1" (T2/T2) to the output of delay circuit 1105 and outputs the value T2/T2 to adder 1102 and comparator 1103. Adder 1102 adds the value -T1/T2 to the value T2/T2 and provides the result to multiplexer 1104. Comparator 1103 compares the output of adder 1101 and the value T1/T2. Since the output of adder 1101 at T2/T2 (1) is less than the value T1/T2 (4/3), comparator 1103 outputs a LOW INCR signal. Because INCR signal is LOW, multiplexer 1104 outputs the output of adder 1101 which is T2/T2. As such, a(0) /T2 is equal to T2/T2. This is consistent with equation (5) above. On the next cycle, a(0)/T2 is provided as an input to adder 1101 which adds it to its other input of T2/T2. Adder 1101 outputs the value 2 to adder 1102 and comparator 1103. Adder 1102 adds -T1/T2 (-4/3) to the value 2 and provides the result (0.667) to multiplexer 1104. Because the output of adder 1101 (2) is greater than the value of T1/T2 (4/3), comparator 1103 outputs a HIGH INCR signal. The HIGH INCR signal triggers multiplexer 1104 to provide the output of adder 1102 (0.667) as the value a(l)/T2. This is consistent with equation (6) above. It is to be appreciated that INCR signal is HIGH (T2/T1)*100% of the time.

The value of a(n) is retrieved from the output of a(n) generator 806 and provided to linear interpolator 502. Signal INCR which is indicative of the ratio T2/T1 is provided as an input to modulo counter 807. Modulo counter 807 receives as a second input the output signal U/4 from U/4 & hysteresis generator 801. When signal INCR is HIGH (e.g., greater than zero), it indicates the start of a new sample B(n), modulo counter 807 decrements its count. While the count in counter 807 is still greater than zero (0), modulo counter 807 generates a LOW signal at its output. On the other hand, when the count reaches zero, modulo counter 807 resets to U/4-1 on its next decrement and generates a HIGH signal at its output meanwhile. The output of modulo counter 807 is provided as the "estimate" read sampling rate $4F_{s1}$ to FIFO buffer 405. As discussed earlier, the "estimate" read sampling rate $4F_{s1}$ is distinguished from the sampling rate $4F_{s1}$.

Figure 12:
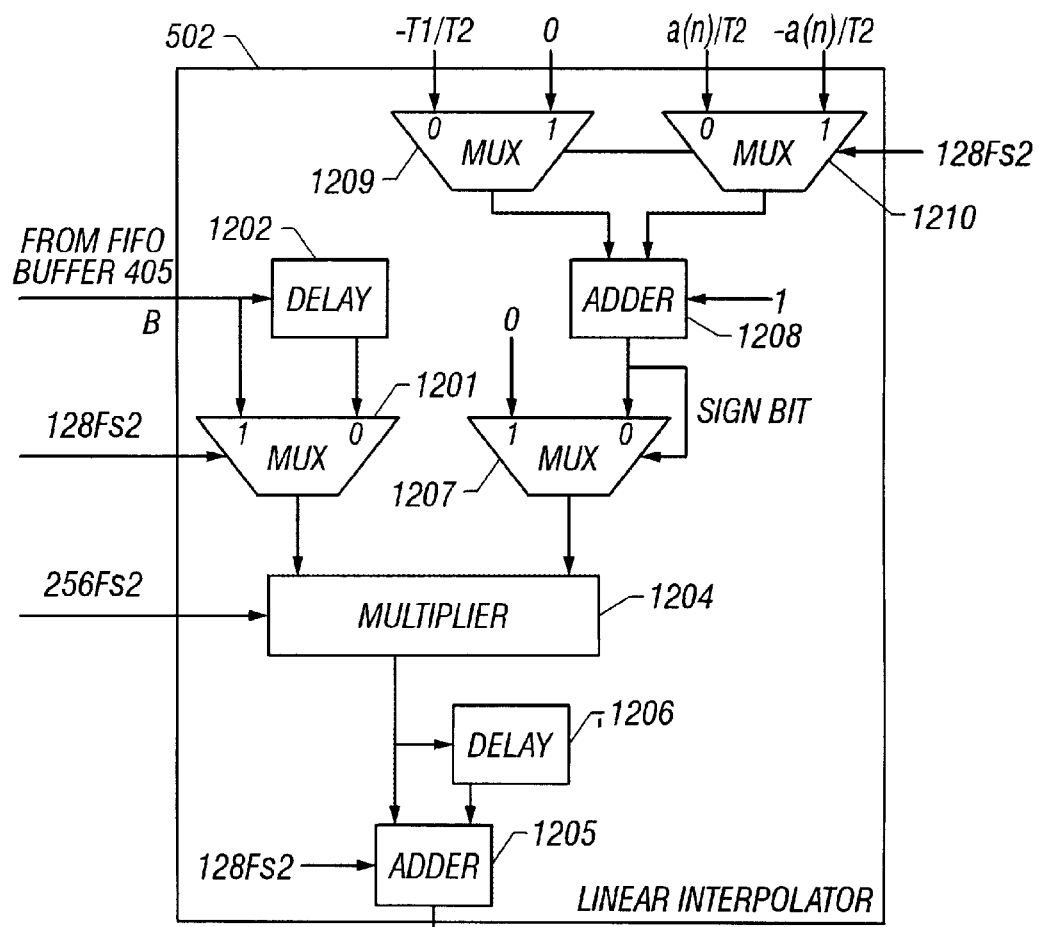
FIG. 12 is a block diagram illustrating linear interpolator 502 inside resampler 302 to generate equation (2).

Referring now to FIG. 12, illustrating linear interpolator 502 to transform signal B to signal C in accordance to equation (2) above is illustrated. Linear interpolator 502 consists of multiplexer 1201, delay 1202, multiplier 1204, adder 1205, delay 1206, multiplexer 1207, adder 1208, multiplexer 1209, and multiplexer 1210.

Output signal B from FIFO buffer 405 of interpolation filter 301 is provided as an input to delay 1202 which in turn provides its output to multiplexer 1201. Output signal B of FIFO buffer 405 is also provided as an input directly to multiplexer 1201. Multiplexer 1201 is controlled by a clock signal of rate $DF_{s2}$ ($128F_{s2}$) which alternately allows the output of either FIFO buffer 501 or its delayed version to pass through as the output of multiplexer 1201. In so doing, the current sample B (n) of the output of FIFO buffer 405 A(n) and its delayed sample A(n+1) are made available as required in equation (2). The output of multiplexer 1201 is provided as input to multiplier 1204. Linear interpolator 502 also receives as inputs the ratio T1/T2 and the value a(n)/T2 from rate estimator 503.

The other input to multiplier 1204 is from an output of a circuitry that is a part of linear interpolator 502. This circuitry is designed to ensure the constants that multiply the samples A(n) and A(n+1) in equation (2) are nonnegative. More particularly, the circuitry is designed to carry out the following conditions:

if $(1-a(n)/T2)<0$ then $B(n)=A(n+1)$ $(1-T1/T2+a(n)/T2)$ if $(1-T1/T2+a(n)/T2)<0$ then $B(n)=A(n)$ $(1-a(n)/T2)$ The circuitry comprises multiplexer 1207, adder 1208, multiplexer 1209, and multiplexer 1210. Multiplexer 1209 receives as input the value −T1/T2 and zero (0). Multiplexer 1209 is controlled by a select clock signal having a rate of $128F_{s2}$. On the other hand, multiplexer 1210 receives as input the value a(n)/T2 and −a(n)/T2 from rate estimator 503. Multiplexer 1210 is also controlled by the same select clock signal having a rate of $128F_{s2}$. When the clock signal is HIGH, multiplexers 1209 and 1210 output the value zero (0) and −a(n)/T2 respectively. Conversely, when the clock signal is LOW, multiplexers 1209 and 1210 output the value −T1/T2 and a(n)/T2 respectively. In so doing, the appropriate values are provided to adder 1208 to calculate the constants (1−a(n)/T2) and (1−T1/T2 +a(n)/T2). In other words, when the clock signal is HIGH, adder 1208 receives the values zero (0) and −a(n)/T2 as inputs. Adder 1208 also receives a value one (1) which is then added to zero (0) and −a(n)/T2. The result is then supplied to multiplexer 1207. When the clock signal is LOW, adder 1208 receives the values −T1/T2 and a(n)/T2 as inputs. Adder 1208 also receives a value one (1) which is then added to −T1/T2 and a(n)/T2.

The result from adder 1208 and its sign bit are then supplied as input as well as a select signal to multiplexer 1207. Multiplexer 1207 receives the value zero (0) as a second input. Having done so, when the output of adder 1208 is positive, the output of adder 1208 is allowed to pass through as the output of multiplexer 1207. Otherwise, when the output of adder 1208 is negative, the value zero (0) is allowed to pass through as the output of multiplexer 1207. As such, the conditions stated above are carried out.

As stated above, the output of multiplexer 1207 is provided as a second output to multiplier 1204. Multiplier 1204 performs an multiplication operation on its two inputs. Multiplier 1204 is designed to operate at a clock rate of $256F_{s2}$ which is twice the clock rate of $DF_{s2}$ ($128F_{s2}$). This allows the two multiplication operations in equation (2) to be carried out by a single multiplier unit. Multiplier 1204 provides the result of the multiplication operation as output to adder 1205 and delay 1206. Delay 1206 adds a delay to the result of multiplier 1204. In so doing, the result of multiplier 1204 for the previous clock cycle can be maintained an extra clock cycle until the result of multiplier 1204 for the current clock cycle is ready. Delay 1206 provides the delayed result of multiplier 1204 to adder 1205.

Figure 13:
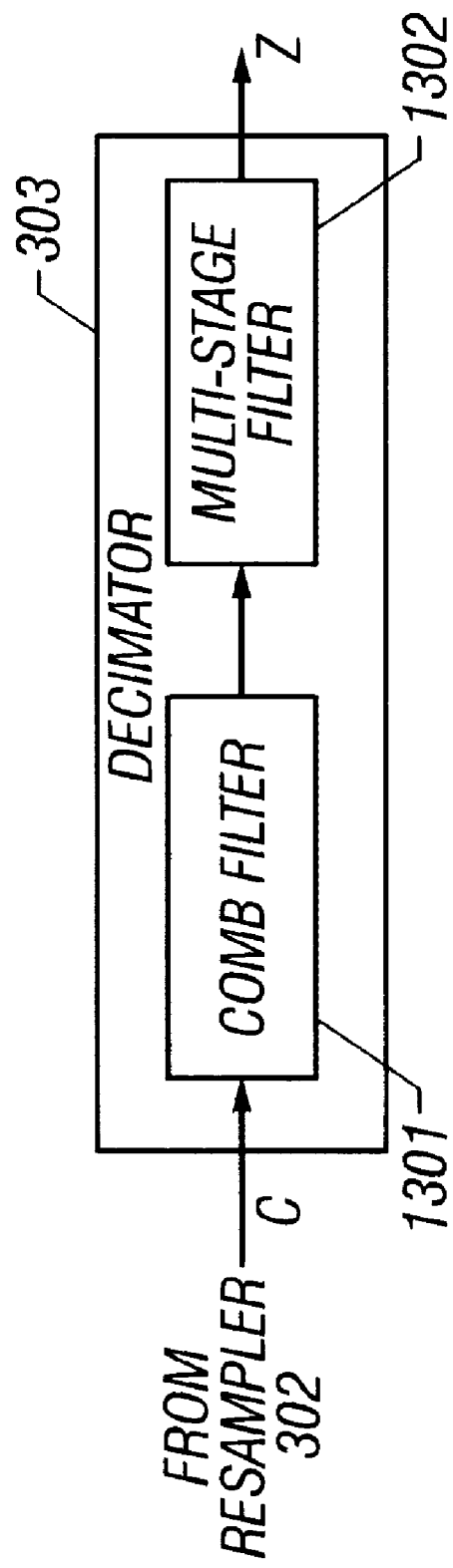
FIG. 13 is a block diagram illustrating decimator 303 of FIG. 3.

The output from linear interpolator 502 is provided as input to noise-shaping quantizer 504 which performs quantization and first-order noise shaping on the signal output from linear interpolator 502 to reduce datapath width. The output from noise-shaping quantizer 504 is provided to decimator 303 which downsamples the filtered signal by a factor of 128 to create signal C(n) having a sample rate of $F_{s2}$. Reference is now made to FIG. 13 illustrating a block diagram of decimator 303 in accordance to the present invention. In the preferred embodiment, decimator 303 has a multi-stage cascade structure comprising a cascading combination of comb filter 1301 and multi-stage filter 1302.

Decimator 303 adopts the above multi-stage cascade structure to reduce the amount of hardware required to perform the needed multiplications in downsampling a factor of 128. In brief, comb filter 1301 incorporates a cascade of three (3) integrators, a factor-of-four (4) downsampler, one (1) integrator, a second factor-of-four (4) downsampler, and four (4) differentiators. By having an equal number of integrators and differentiators operating at different rates, multiplications operations needed in downsampling are performed substantially without requiring multiplier hardware. Comb filter 1301 is well-known to persons of ordinary skill in the art and is not discussed further. Multi-stage filter 1302 performs a factor-of-eight (8) downsampling in different stages as well as some lowpass filtering in between the downsampling stages to further reduce the aliases and images in the baseband region. As discussed earlier, the filtering in the decimation stage relaxes the requirements placed on the interpolation stage and vice versa.

The preferred embodiment of the present invention, an asynchronous sample rate converter, is thus described. While the present invention has been described in particular embodiments, the present invention should not be construed as limited by such embodiments, but rather construed according to the below claims.

What is claimed is:

1. An asynchronous sample rate converter for converting a first sample rate Fs1 of a signal A to a second sample rate Fs2 comprising:

an interpolation filter receiving as input the signal A having the first sample rate Fs1, the interpolation filter upsampling the sample rate to a sample rate UFs1, where the upsampling factor U is directly related to a ratio of Fs2/Fs1, the interpolation filter removing images during upsampling, the interpolation filter providing as output a signal B(n) having the upsampled sample rate UFs1;

a resampler receiving as input the signal B(n) from the interpolation filter, the resampler resampling the signal B(n) to have a sample rate DFs2, where D is a downsampling factor, the resampler performing linear interpolation on the resampled signal, the resampler providing as output the linearly interpolated signal C(n) having the sample rate DFs2 wherein the resampler comprises a linear interpolator circuit that performs linear interpolation on the signal B(n) so that magnitude attenuation zeros are placed in a frequency spectrum of the signal B(n) at integer multiples of the sample rate DFs2; and a decimation filter receiving as input the linearly interpolated signal having the sample rate DFs2, the decimation filter downsampling the linearly interpolated signal C(n) having the sample rate DFs2 to a signal Z having the second sample rate Fs2.

2. The sample rate converter of claim 1, wherein the resampler comprises:

a linear interpolator circuit connected to the interpolation filter, the linear interpolating circuit performs linear interpolation on the signal B(n) to generate the linearly interpolated signal C(n) based on:

$C(n)=B(n) (1-a(n)/T2)+B(n+1) (1-T1/T2+a(n)/T2).$ wherein a(n) is a relative time difference between a sample under the sample rate $UF_{s1}$ and a corresponding sample under the second sample rate $DF_{s2}$, $T1=1/UF_{s1}$, $T2=1/DF_{s2}$, and if $(1-a(n)/T2)<0$ then $C(n)=B(n+1) (1-T1/T2+a(n)/T2)$ if $(1-T1/T2+a(n)/T2)<0$ then $C(n)=B(n) (1-a(n)/T2).$ 3. The sample rate converter of claim 1, wherein the linear interpolator circuit is connected to the interpolation filter and the linear interpolating circuit performs linear interpolation on the signal B(n) to generate the linearly interpolated signal C(n) based on:

$C(n)=B(n) (1-a(n)/T2)+B(n+1) (1-T1/T2+a(n)/T2),$ wherein a(n) is a relative time difference between a sample under the sample rate UFs1 and a corresponding sample under the second sample rate DFs2, T1=1/UFs1, T2=1/DFs2, and if$(1-a(n)/T2)<0$, then $C(n)=B(n+1)(1-T1/T2+a(n)/T2)$; and if $(1-T1/T2+a(n)<$, then $C(n)=B(n) (1-a(n)/T2).$ 4. The sample rate converter of claim 3, wherein the resampler further comprises a first-order noise shaping quantizer connected to the linear interpolator circuit.

5. The sample rate converter of claim 3, wherein the resampler further comprises:

a rate estimator circuit connected to the interpolation filter and the linear interpolator circuit, the rate estimator generates ratio T1/T2, the rate estimator generates the relative time difference a(n) according to:

$a(n)=nT2-T1*Floor(nT2/T1)$ $a(n+1)=a(n)+T2-T1*Floor((a(n)+T2)/T1)$ where n=0, 1, 2, 3 . . . and where the function Floor means the greatest integer less than,
and the rate estimator generates an estimate sampling rate 4Fs1.

6. The sample rate converter of claim 5, wherein the factor D is equal to 128.

7. The sample rate converter of claim 5, wherein the rate estimator circuit comprises:

a U/4 and hysteresis generator receiving as inputs signals having frequencies $MF_{s1}$ and $NF_{s2}$, the U/4 and hysteresis generator providing as output a variable upsampling factor U/4;

a multiplier receiving as inputs the variable factor U/4 and an input of frequency $MF_{s1}$, the multiplier multiplying the variable upsampling factor U/4 with the sample rate $MF_{s1}$ to generate an output;

an a(n) generator;

an adder receiving as inputs the negative output of the multiplier and a feedback first output T2/T1 from the a(n) generator, the adder providing as an output the difference between the output of the multiplier and the feedback first output T2/T1;

a gain scaler receiving as input the output of the adder, the gain scaler scaling the output of the adder by a predetermined gain factor, the gain scaler providing a scaled output;

an integrator receiving as input the scaled output, the integrator integrating the scaled output to produce the ratio T1/T2, the integrator providing as an output the ratio T1/T2 to the a(n) generator, wherein the a(n) generator providing as a first output value T2/T1 and as a second output the relative time difference a(n); and a modulo counter receiving as inputs the first output T2/T1 and the variable upsampling factor U/4 from the U/4 and hysteresis generator, the modulo counter essentially dividing the value T2/T1 by the variable upsampling factor U/4 to generate a signal having an estimate sampling rate $4F_{s1}$.

8. The sample rate converter of claim 7, wherein the factors M and N are equal to 4.

9. The sample rate converter of claim 7, wherein the modulo counter provides the estimate sampling rate $4F_{s1}$ to the interpolation filter thereby implicitly implementing a U/4 zero-order hold in the interpolation filter and retiming data from the interpolation filter to a frequency $128F_{s2}$.

10. The sample rate converter of claim 7, wherein the U/4 and hysteresis generator comprising:

a 10-bit counter receiving as input the signal having rate $4F_{s2}$, the 10-bit counter monitoring a count of the sample clock signal having the rate 4Fs2;

an 8-bit counter receiving as input the signal having rate 4Fs1, the 8-bit counter monitoring a count of the signal having the rate $4F_{s1}$; wherein when the 8-bit counter overflows, the 10-bit counter holds a current count;

a right-shifter receiving as input the current count from the 10-bit counter, the right-shifter shifting the current count right three times, the right-shifter truncating the lower three bits of the shifted count, the right-shifter providing as output the shifted truncated count; and an adder receiving as input the output of the right-shifter and a negative two (2) constant, the adder adding the output of the right-shifter to the negative two (2) constant to produce a current upsampling factor U/4.

11. The sample rate converter of claim 10, wherein the U/4 and hysteresis generator further comprises:

a register storing an upsampling factor U4 previously outputted from the adder; and a comparator circuit receiving as input the current upsampling factor U4 from the adder and the previous upsampling factor U/4 from the register, the comparator circuit determining whether the current upsampling factor U/4 differs from the previous upsampling factor U/4 by two (2) or more, the comparator circuit transferring the current upsampling factor U4 to the register to be stored if current upsampling factor U/4 differs from the previous upsampling factor U/4 by two (2) or more.

12. The sample rate converter of claim 7, wherein the a(n) generator comprises:

a delay circuit having an input signal and an output signal;

a multiplexer having an output signal connected to the input signal of the delay circuit;

a first adder receiving as input a constant value one (1) and the output signal from the delay circuit, the first adder calculating the sum of the inputs, the first adder providing the sum as an output;

a second adder receiving as input the output of the first adder and a negative T1/T2 value, the second adder calculating a sum of the inputs, the second adder providing the sum as an output; and a comparator receiving as input the output of the first adder and the T1/T2 value, the comparator outputting a HIGH INCR signal if the output of the first adder is greater than the positive T1/T2 value, the comparator outputting a LOW INCR signal if the output of the first adder is less than the positive T1/T2 value;

wherein the multiplexer receiving as input the output of the first and second adders, the multiplexer receiving as select signal the INCR signal outputted by the comparator, the INCR signal controlling which input signal to pass through as the output signal.

13. The sample rate converter of claim 3, wherein the linear interpolator circuit comprises:

a first delay circuit receiving as input the output of the interpolation filter;

a first multiplexer driven by a select signal having a frequency of $128F_{s2}$, the first multiplexer receiving as inputs the output of the interpolation filter and a delayed signal from the first delay circuit a second multiplexer receiving as inputs the constant zero (0) and a negative value T1/T2, herein, the second multiplexer receiving as a select signal the clock signal having the rate 128Fs2, the second multiplexer passing the constant zero as an output when the clock signal is HIGH, the second multiplexer passing the negative value T1/T2 as the output when the clock signal is LOW;

a third multiplexer receiving as input a positive normalized time difference a(n)/T2 and a negative normalized time difference −a(n)/T2, the third multiplexer receiving as a select signal the clock signal having the rate $128F_{s2}$, the third multiplexer passing positive normalized time difference a(n)/T2 as an output when the clock signal is HIGH, the third multiplexer passing the negative normalized time difference −a(n)/T2 as the output when the clock signal is LOW;

a first adder receiving as input the output of the second and third multiplexers and a constant value one (1), the first adder computing as sum of the inputs received, the first adder providing as output the sum;

a fourth multiplexer receiving as input the sum output from the first adder and a constant zero (0), the fourth multiplexer receiving a sign bit of the sum output from the first adder as a select signal, the fourth multiplexer passing constant zero as an output when the select signal is HIGH, the fourth multiplexer passing the sum output from the first adder as the output when the clock signal is LOW;

a multiplier receiving as input the output of the first and fourth multiplexers, the multiplier being clocked by a clock signal having a rate of $256F_{s2}$, the multiplier calculating a product of the inputs, the multiplier providing as output the product;

a second delay circuit receiving as input the product from the multiplier, the second delay circuit providing a delayed product as output; and a second adder receiving as input the product from the multiplier and the delayed product from the second delay circuit, the second adder being clocked by a clock signal having a rate of $128F_{s2}$, the second adder calculating the sum of the inputs.

14. A digital audio system comprising:

a drive mechanism unit;

a plurality of digital signal processors coupled to the drive mechanism unit;

a central processor coupled to the plurality of digital signal processors;

a digital audio input/output (I/O) circuit coupled to the digital signal processors, the digital audio I/O circuit having an asynchronous sample rate converter for converting a first sample rate Fs1 of a signal A to a second sample rate Fs2 comprising:

an interpolation filter receiving as input the signal A having the first sample rate Fs1, the interpolation filter upsampling the sample rate to a sample rate UFs1, where the upsampling factor U is directly related to a ratio of Fs2/Fs1, the interpolation filter removing images during upsampling, the interpolation filter providing as output a signal B(n) having the upsampled sample rate UFs1;

a resampler receiving as input the signal B(n) from the interpolation filter, the resampler resampling the signal B(n) to have a sample rate DFs2, where D is a down-sampling factor, the resampler performing linear interpolation on the resampled signal, the resampler providing as output the linearly interpolated signal C(n) having the sample rate DFs2 wherein the resampler comprises a linear interpolator circuit that performs linear interpolation on the signal B(n) so that magnitude attenuation zeros are placed in a frequency spectrum of the signal B(n) at integer multiples of the sample rate DFs2; and a decimation filter receiving as input the linearly interpolated signal having the sample rate DFs2, the decimation filter downsampling the linearly interpolated signal C(n) having the sample rate DFs2 to a signal Z having the second sample rate Fs2.

15. The digital audio system of claim 14, wherein the upsampling factor U is determined according to:

$$U=4 \text{ Floor}((D/4)*(Fs2/Fs1)-2)$$

where the function Floor means the greatest integer less than, wherein the upsampling factor U is maintained such that UFs1 is less than DFs2.

16. The digital audio system of claim 14, wherein the linear interpolator circuit is connected to the interpolation filter and the linear interpolating circuit performs linear interpolation on the resampled signal B(n) to generate the linearly interpolated signal C(n) based on:

$$C(n)=B(n)(1-a(n)/T2)+B(n+1)(1-T1/T2+a(n)/T2),$$

wherein a(n) is a relative time difference between a sample under the sample rate UFs1 and a corresponding sample under the second sample rate DFs2, T1=1/UFs1, T2=1/DFs2, and if (1−a(n)/t2)<, then $C(n)=B(n+1)(1-T1/T2+a(n)/T2)$; and if (1−T1/T2+a(n)/T2)<0, then $C(n)=B(n)(1-a(n)/T2)$.

17. The digital audio system of claim 16, wherein the resampler further comprises a first-order noise shaping quantizer connected to the linear interpolator circuit.

18. The digital audio system of claim 16, wherein the resampler further comprises:

a rate estimator circuit connected to the interpolation filter and the linear interpolator circuit, the rate estimator generates ratio T1/T2, the rate estimator generates the relative time difference a(n) according to:

$$a(n)=nT2-T1*\text{Floor}(nT2/T1)$$

$$a(n+1)=a(n)+T2-T1*\text{Floor}((a(n)+T2)/T1)$$

where n=0, 1, 2, 3, . . . and where the function Floor means the greatest integer less than, and the rate estimator generates an estimate sampling rate 4Fs1.

19. The digital audio system of claim 18, wherein the factor D is equal to 128.

20. The digital audio system of claim 18, wherein the rate estimator circuit comprises:
- a U/4 and hysteresis generator receiving as input signals having frequencies MFs1 and NFs2, the U/4 and hysteresis generator providing as output a variable upsampling factor U/4;
- a multiplier receiving as inputs the variable factor U/4 and an input of frequency MFs1, the multiplier multiplying the variable upsampling factor U/4 with the sample rate MFs1 to generate an output;
- an a(n) generator;
- an adder receiving as inputs the negative output of the multiplier and a feedback first output T2/T1 from the a(n) generator, the adder providing as an output the difference between the output of the multiplier and the feedback first output T2/T1;
- a gain scaler receiving as input the output of the adder, the gain scaler scaling the output of the adder by a predetermined gain factor, the gain scaler providing a scaled output;
- an integrator receiving as input the scaled output, the integrator integrating the scaled output to produce the ratio T1/T2, the integrator providing as an output the ratio T1/T2 to the a(n) generator, wherein the a(n) generator providing as a first output value T2/T1 and as a second output the relative time difference a(n); and
- a modulo counter receiving as inputs the first output T2/T1 and the variable upsampling factor U4 from the U/4 and hysteresis generator, the modulo counter essentially dividing the value T2/T1 by the variable upsampling factor U/4 to generate a signal having an estimate sampling rate 4Fs1.

21. The digital audio system of claim 20, wherein the factors M and N are equal to 4.

22. The digital audio system of claim 20, wherein the modulo counter provides the estimate sampling rate $4F_{s1}$ to the interpolation filter thereby implicitly implementing a U/4 zero-order hold in the interpolation filter and retiming data from the interpolation filter to a frequency $128F_{s2}$.

23. The digital audio system of claim 20, wherein the U/4 and hysteresis generator comprising:
- a 10-bit counter receiving as input the signal having rate $4F_{s2}$, the 10-bit counter monitoring a count of the sample clock signal having the rate $4F_{s2}$;
- an 8-bit counter receiving as input the signal having rate $4F_{s1}$, the 8-bit counter monitoring a count of the signal having the rate $4F_{s1}$; wherein when the 8-bit counter overflows, the 10-bit counter holds a current count;
- a right-shifter receiving as input the current count from the 10-bit counter, the right-shifter shifting the current count right three times, the right-shifter truncating the lower three bits of the shifted count, the right-shifter providing as output the shifted truncated count; and
- an adder receiving as input the output of the right-shifter and a negative two (2) constant, the adder adding the output of the right-shifter to the negative two (2) constant to produce a current upsampling factor U/4.

24. The digital audio system of claim 23, wherein the U/4 hysteresis generator further comprises:
- a register storing an upsampling factor U/4 previously outputted from the adder; and
- a comparator circuit receiving as input the current upsampling factor U/4 from the adder and the previous upsampling factor U/4 from the register, the comparator circuit determining whether the current upsampling factor U/4 differs from the previous upsampling factor U/4 by two (2) or more, the comparator circuit transferring the current upsampling factor U/4 to the register to be stored if current upsampling factor U/4 differs from the previous upsampling factor U/4 by two (2) or more.

25. The digital audio system of claim 20, wherein the a(n) generator comprises:
- a delay circuit having an input signal and an output signal;
- a multiplexer having an output signal connected to the input signal of the delay circuit;
- a first adder receiving as input a constant value one (1) and the output signal from the delay circuit, the first adder calculating the sum of the inputs, the first adder providing the sum as an output;
- a second adder receiving as input the output of the first adder and a negative T1/T2 value, the second adder calculating a sum of the inputs, the second adder providing the sum as an output; and
- a comparator receiving as input the output of the first adder and the T1/T2 value, the comparator outputting a HIGH INCR signal if the output of the first adder is greater than the positive T1/T2 value, the comparator outputting a LOW INCR signal if the output of the first adder is less than the positive T1/T2 value;
- wherein the multiplexer receiving as input the output of the first and second adders, the multiplexer receiving as select signal the INCR signal outputted by the comparator, the INCR signal controlling which input signal to pass through as the output signal.

26. The digital audio system of claim 16, wherein the linear interpolator circuit comprises:
- a first delay circuit receiving as input the output of the interpolation filter;
- a first multiplexer driven by a select signal having a frequency of $128F_{s2}$, the first multiplexer receiving as inputs the output of the interpolation filter and a delayed signal from the first delay circuit
- a second multiplexer receiving as inputs the constant zero (0) and a negative value T1/T2, wherein, the second multiplexer receiving as a select signal the clock signal having the rate $128F_{s2}$, the second multiplexer passing the constant zero as an output when the clock signal is HIGH, the second multiplexer passing the negative value T1/T2 as the output when the clock signal is LOW;
- a third multiplexer receiving as input a positive normalized time difference a(n)/T2 and a negative normalized time difference –a(n)/T2, the third multiplexer receiving as a select signal the clock signal having the rate $128F_{s2}$, the third multiplexer passing positive normalized time difference a(n)/T2 as an output when the clock signal is HIGH, the third. multiplexer passing the negative normalized time difference –a(n)/T2 as the output when the clock signal is LOW;
- a first adder receiving as input the output of the second and third multiplexers and a constant value one (1), the first adder computing as sum of the inputs received, the first adder providing as output the sum;
- a fourth multiplexer receiving as input the sum output from the first adder and a constant zero (0), the fourth multiplexer receiving a sign bit of the sum output from the first adder as a select signal, the fourth multiplexer passing constant zero as an output when the select signal is HIGH, the fourth multiplexer passing the sum output from the first adder as the output when the clock signal is LOW;

a multiplier receiving as input the output of the first and fourth multiplexers, the multiplier being clocked by a clock signal having a rate of $256F_{s2}$, the multiplier calculating a product of the inputs, the multiplier providing as output the product;

a second delay circuit receiving as input the product from the multiplier, the third delay circuit providing a delayed product as output; and a second adder receiving as input the product from the multiplier and the delayed product from the second delay circuit, the second adder being clocked by a clock signal having a rate of $128F_{s2}$, the second adder calculating the sum of the inputs.

27. A method for asynchronously converting a first sample rate Fs1 in a signal A into a second sample rate Fs2, the method comprising the steps of:

a) upsampling and filtering a signal A to form an upsampled signal B(n) having a sample rate UFs1, where the upsampling factor U is directly related to a ratio of Fs2/Fs1;

b) resampling and linearly interpolating the upsampled signal to form a linearly interpolated signal C(n) having a sample rate DFs2, wherein D is a downsampling factor and wherein magnitude attenuation zeros are placed in a frequency spectrum of the signal B(n) at integer multiples of the sample rate DFs2; and c) downsampling the resampled signal C(n) to form a signal Z having a sample rate Fs2.

28. The method of claim 27, wherein the upsampling factor U is based on:

$$U = 4\,\text{Floor}((D/4)*(F_{s2}/F_{s1})-2)$$

where the function Floor means the greatest integer less than, wherein the upsampling factor U is maintained such that UFs1 is less than DFs2.

29. The method of claim 27, wherein the linearly interpolated signal C(n) is based on:

$$C(n) = B(n)\,(1-a(n)/T2) + B(n+1)\,(1-T1/T2+a(n)/T2),$$

wherein a(n) is a relative time difference between a sample under the sample rate UFs1 and a corresponding sample under the second sample rate DFs2, T1=1/UFs2, and if $(1-a(n)/T2)<0$, then $(n)=B(n+1)\,(1-T1/T2+a(n)/T2)$; and if $(1-T1/T2+a(n)/T2)<0$, then $C(n)=B(n)\,(1-a(n)/T2)$.

30. The method of claim 29, wherein the relative time difference a(n) is based on:

$$a(n) = nT2 - T1*\text{Floor}(nT2/T1)$$

$$a(n+1) = a(n) + T2 - T1*\text{Floor}((a(n)+T2)/T1)$$

where n=0, 1, 2, 3 . . . and where the function Floor means the greatest integer less than.

31. The method of claim 30, wherein the factor D is equal to 128.

* * * * *